(12) United States Patent
Pruessmann et al.

(10) Patent No.: US 6,252,399 B1
(45) Date of Patent: Jun. 26, 2001

(54) METHOD AND DEVICE FOR MAGNETIC RESONANCE IMAGING

(75) Inventors: Klaas P. Pruessmann, Zurich (CH); Matthias Stuber, Brookline, MA (US); Xavier G. Golay; Henryk M. Faas, both of Zurich (CH); Peter Boesiger, Ennetbaden (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/209,088

(22) Filed: Dec. 10, 1998

(30) Foreign Application Priority Data

Dec. 12, 1997 (EP) .................................................. 97203906
Jun. 25, 1998 (EP) .................................................. 98202108

(51) Int. Cl.$^7$ ....................................................... G01V 3/00
(52) U.S. Cl. ............................................................ 324/307
(58) Field of Search ..................................... 324/307, 309

(56) References Cited

U.S. PATENT DOCUMENTS

| 4,521,733 | * | 6/1985 | Bottomley et al. | 324/309 |
| 4,701,708 | | 10/1987 | Hardy et al. | 324/311 |
| 5,402,785 | | 4/1995 | Leigh et al. | 128/653.2 |
| 5,532,594 | | 7/1996 | Cory et al. | 324/307 |
| 5,755,666 | * | 5/1998 | Bornert et al. | 600/410 |

OTHER PUBLICATIONS

C. Bushong, Stewart, Magnetic Resonance Imaging Physiacal and biological Principles, 1996, p. 76.*

* cited by examiner

Primary Examiner—Christine Oda
Assistant Examiner—Dixomara Vargas
(74) Attorney, Agent, or Firm—John F. Vodopia

(57) ABSTRACT

The invention relates to a method for determining an image of a portion of a body by means of magnetic resonance (MR), which method comprises a step for rotating a magnetization of spins in a selected portion of the body and by generating an RF pulse in a selected slice. The RF pulse comprises a concatenation of a selective first RF pulse and a second selective RF pulse.

7 Claims, 4 Drawing Sheets

METHOD AND DEVICE FOR MAGNETIC RESONANCE IMAGING

BACKGROUND OF THE INVENTION

1. Field of the Invention

The invention relates to a method for determining an image of a first portion of a body placed in a steady magnetic field by means of magnetic resonance (MR), which method comprises the following steps;
excitation of nuclear spins in the first portion,
measurement of a data set of MR signals of the first portion of the body, and
reconstruction of the image from the measured data set, the method also comprising the generation of an RF pulse rotation of a magnetization in a second portion of the body. The invention also relates to an MR apparatus for carrying out such a method, comprising;
means for generating temporary magnetic gradient fields,
means for generating RF pulses,
means for receiving MR signals,
processing means for the reconstruction of an image of the MR signals received,
control means for the generation of control signals for the means for generating temporary magnetic gradient fields and for the means for generating RF pulses,
the control means also being arranged to generate an MR imaging sequence comprising an RF excitation pulse and an RF pulse for rotation of a magnetization within the second portion of the body.

2. Description of Related Art

Such a method is known from U.S. Pat. No. 5,402,785. The known method is used for the magnetic resonance imaging of a part of a body of an animal or human. The MR images obtained may be used as a tool for the diagnosis of a decease of the animal or human by determining perfusion in, for example a part of the brain. Perfusion images show motion of blood in vessels and capillaries in tissue of the human or animal under examination. The known method comprises the determination of perfusion by labelling atoms in a fluid in the second portion located upstream with respect to a flow of liquid towards the first portion, the generating of a steady state in the substance by continuing to label atoms until the effect caused by the labelled atoms perfusing in the substance reaches a steady state, and the generating of image information so as to determine perfusion in the first portion of the body. The labelling involves continuous inversion of spins associated with the atoms in the second portion. In this way the second portion in the form of a slice is selected for which a Larmor frequency of the spins in the slice equals the frequency of the RF pulse. A drawback of the known inversion pulse is that the obtained slice profile deviates from a nominal selection profile, for example a rectangle.

SUMMARY OF THE INVENTION

It is an object of the invention to improve the selection profile, so that the deviation from a nominal selection profile are reduced. To this end, a method in accordance with the invention is characterized in that the RF pulse for 180 degree rotation comprises a concatenation of a first selective RF pulse and a second selective RF pulse. Further advantageous embodiments of the method according to the invention are defined in the dependent Claims. The application of the concatenation of the first selective RF pulse and the second selective RF pulse provides a slice selection with twice a flip angle of a single sequence comprising an RF pulse and a magnetic gradient field. In this way the quality of the slice profile of the RF pulse employed in the single sequences is maintained for slice profile obtained for the concatenation of the first and second selective RF pulses. The slice quality of the selected slice resulting from the concatenation of RF pulses can be compared with that resulting from conventional RF pulses. Such pulses are known per se from the handbook "Magnetic Resonance Imaging" by M. T. Vlaardingerbroek et al, Springer Verlag, page 49. Furthermore, the slice quality is maintained because the axes of rotation describing a magnetization rotation of a single sequence lie in a x,y-plane of a reference co-ordinate system x,y,z for all points in the selected slice. A quality with respect of a selected slice profile can be defined as a ratio of missing magnetic moment inside the slice and a magnetic moment of a perfectly rectangular slice. The slice limits are defined such that a magnetic moment in a z-direction outside the slice is equal to a missing magnetic moment in the z-direction inside the slice. Furthermore, the first portion may coincide with the second portion of the body. The RF deposition of a concatenation of the first and second selective RF pulses is roughly proportional to a nominal flip angle based on the sum of the flip angles of the first and second RF pulses. The RF power reduction can thus be 50% or more for an equal slice selection profile compared to the known RF pulse. In this context the z-direction of a reference co-ordinate system x,y,z corresponds to a direction of the steady magnetic field. For the perfect rectangular slice profile the ratio will be zero percent.

A particular version of the method in accordance with the invention is characterized in that
a first magnetic field gradient pulse is generated with the first selective RF pulse according to a first gradient function of time,
a second magnetic field gradient pulse is generated with the second selective RF pulse according to a second gradient function of time being a time, reversed version of the first gradient function,
a sign of the second gradient function opposes that of the first gradient function,
the first selective RF pulse is applied according to a first amplitude modulation function of time and a first frequency modulation function of time,
the second RF pulse is applied according to a second amplitude modulation function and a second frequency modulation function,
the second amplitude modulation function is a time reversed version of the first amplitude function,
the second frequency modulation function is a time reversed version of the first frequency modulation function, and
a sign of the second frequency modulation function opposes to that of the first frequency modulation function. In this way, for example, a highly selective inversion pulse can be obtained by the concatenation of the first selective RF pulse and the second RF pulse, because a flip angle of the z-magnetization is exactly doubled at all positions within the selected slice. RF-pulses having a large flip angle can thus be derived from RF-pulses having a small angle without loss of profile quality. For the concatenation of the first and the second selective RF pulse a slice quality of for example, 3.5 percent can be obtained. Whereas the slice quality of a slice selected by, for example, a conventional 180 degree inversion RF pulse amounts to 7 percent. An example of such a conventional inversion RF pulse comprises an asymmetric amplitude envelope.

A further version of the method in accordance with the invention is characterized in that the RF-pulse for rotation of the magnetisation is generated before an excitation RF pulse. The concatenated RF pulses are thus used as an inversion pulse. Inversion recovery imaging sequence are known per se from the cited handbook "Magnetic Resonance Imaging", by M. T. Vlaardingerbroek et al, Springer-Verlag, 1996, page 77. In this way a $T_1$-weighted MR image can be acquired from the selected first portion of the body.

A further version of the method in accordance with the invention is characterized in that the RF pulse for 180 degree rotation of the magnetization is generated after an excitation RF pulse and in that a further magnetic field gradient pulse is applied in the direction normal to the selected slice. The concatenation of the first selective RF pulse and the second RF pulse can be applied as a refocusing pulse in, for example a known Echo Planar Imaging (EPI) imaging sequence or in a known spin echo imaging sequence or gradient and spin echo sequence (GRASE). These imaging sequences are known per se from international patent application WO 93/01509. In the known spin echo sequence or EPI sequence the concatenation of the first and second RF pulses is generated after the excitation of the nuclear spins for a 180 degree rotation of the magnetization in the selected slice in order to rephase the spins in the selected first portion so as to generate an MR signal. The area of the magnetic field gradient pulse depends on the first gradient RF pulse and on the modulation function of the first and second RF pulses.

A further version of the method in accordance with the invention is characterized in that a time interval between the first RF pulse and the second RF pulse amounts to approximately 4 millisecond.

It is further object of the invention to provide an MR apparatus having an improved selection profile. This object according to the invention is achieved in a magnetic resonance imaging device as defined in claim 7.

These and other aspects of the invention will be apparent from and elucidated with reference to the embodiments described hereinafter.

DETAILED DESCRIPTION OF THE PREFERRED EMBODIMENT

Figure 1:
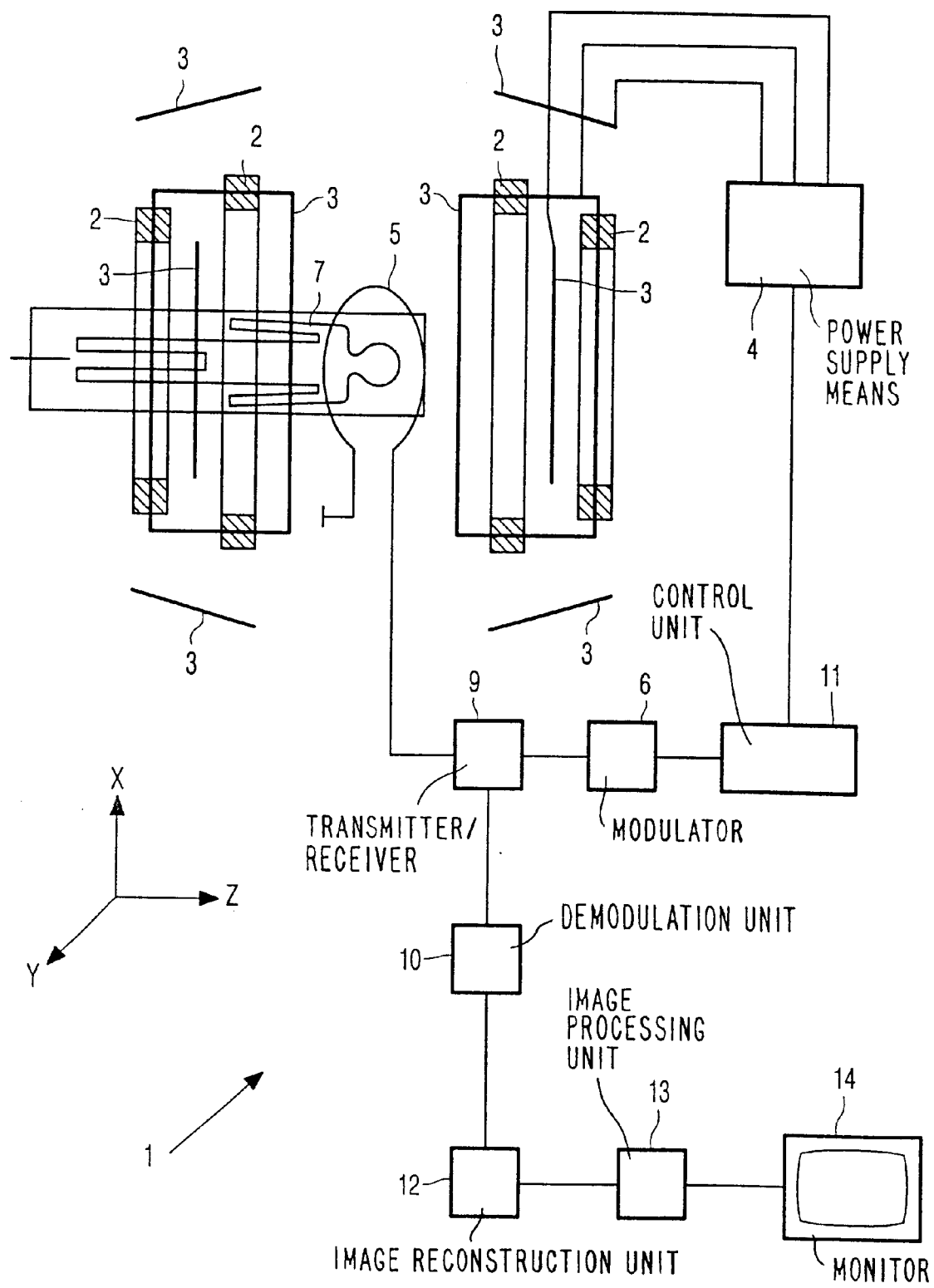
FIG. 1 shows an embodiment of an MR apparatus.

FIG. 1 shows an embodiment of an MR apparatus 1. The MR apparatus 1 comprises a first magnet system 2 for generating a steady magnetic field. The z-direction of the co-ordinate system shown corresponds to the direction of the steady magnetic field in the magnet system 2. The MR apparatus also comprises a second magnet system 3 for generating temporary magnetic fields directed in the z-direction and having gradients in the x, y and z direction, respectively. It is to be noted that for ease of argument x, y and z are used for the frequency encode, phase encode and selection direction, respectively. These directions do not have to coincide with the main directions of the system. Furthermore, in this Application the temporary gradient fields having a gradient in the x-direction, the y-direction and the z-direction are referred to as read gradient, phase-encode gradient and slice-selection gradient, respectively. Power supply means 4 feed the second magnet system 3. The magnet system 2 encloses an examination space which is large enough to accommodate a part of an object 7 to be examined, for example a part of a human body. An RF transmitter coil 5 serves to generate RF magnetic fields and is connected via a transmitter/receiver circuit 9, to an RF source and modulator 6. The RF transmitter coil 5 is arranged around the part of the body 7 in the examination space. The MR apparatus also comprises a receiver coil which is connected via the transmitter/receiver circuit 9 to a signal amplification and demodulation unit 10. The receiver coil and the RF transmitter coil 5 may be one and the same coil. A control unit 11 controls the modulator 6 and the power supply means 4 in order to generate MR imaging sequences comprising RF-pulses and temporary magnetic gradient fields. After excitation of nuclear spins in a part of the body placed within the examination space, the receiver coil 5 receives an MR signal. The phase and amplitude derived therefrom are sampled and further processed in the amplification and demodulation unit 10. An image reconstruction unit 12 processes the MR signals presented so as to form an image. The image is displayed via an imaging processing unit 13, for example, on a monitor 14. The control unit 11 also controls the image reconstruction unit 12. The concatenation of a first selective RF pulse and a second selective RF pulse will be explained with reference to the FIGS. 2, 3, 4 5 and 6.

Figure 2:
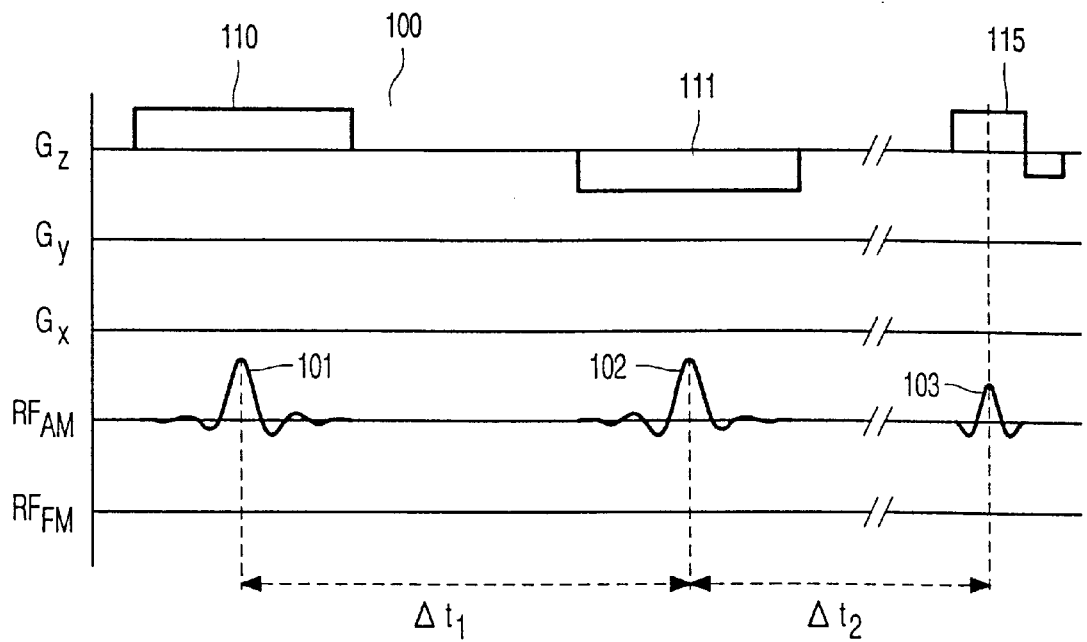
FIG. 2 shows an example of a concatenation of a first and a second selective RF pulse

FIG. 2 shows an example of a concatenation of a first selective RF pulse 101 and a the second selective RF pulse 102 which serves to obtain an inversion of magnetization in a selected slice with a reduced RF power deposition compared to the known inversion RF-pulse. The invention RF-pulse is known per se from the cited Handbook "Magnetic Resonance Imaging", by M. T. Vlaardingerbroek et al,. Springer Verlag, page 49. In the present example the concatenation of pulses 100 is used for the inversion of the magnetization of the spins of the protons in a selected portion of the body, for example a slice. The first RF pulse 101 rotates the magnetization of the protons due the steady magnetic field and a transverse component of the magnetization is obtained in the selected slice. The first RF pulse 101 is applied according to a first amplitude modulation function of time $f_{am1}(t)$ and a first frequency modulation function of time $f_{fm1}(t)$. The first RF pulse 101 is rendered slice selective in the selected slice of the body by a first magnetic field gradient pulse 110 applied according to a first gradient function $f_{grad1}(t)$. Preferably, the first amplitude modulation function of time $f_{am1}(t)$, the frequency modulation function of time $f_{fm1}(t)$ and the first gradient function $f_{grad1}(t)$ have a duration T. The duration T of the RF pulse 101 amounts to, for example 1 millisecond. In the selected slice the Larmor frequency is equal to the RF frequency of the RF-pulse 101. A second RF pulse 102 is applied an interval $\Delta t_1$ after the first RF pulse 101. The interval $\Delta t_1$ runs from the maximum of the amplitude of the frist RF selective pulse 101 until the maximum of the amplitude of the second RF pulse 102. The second RF pulse 102 is applied according to a second amplitude modulation function $f_{am2}$ and a second frequency modulation function $f_{fm2}(t)$, the second amplitude modulation function being a time reversed version of the first frequency modulation function, so $f_{am2}(t)=f_{am1}(T-t)$. The second frequency modulation function $f_{fm2}(t)$ is a time reversed version of the first frequency modulation function, the sign of the second frequency modulation opporing of the first frequency modulation function, so $f_{fm2}(t)=-f_{fm1}(T-t)$. An example of the first amplitude modulation function $f_{am1}$ is a sincgauss function numerically optimised for a sharp selection profile defined by $$B_1(t) = jG_z d \frac{\sin kd/2}{kd/2} \exp(-at^2)$$

wherein
$B_1(t)$ represents the RF field,
$G_z$ represents the strength of the steady magnetic field,
d represents the slice thickness,
a represents a constant,
t represents time, and
$k=-\gamma G_z t$, wherein $\gamma$ represents a gyromagnetic ratio of the excited nuclei.
An example of a first frequency modulation function comprises a constant zero. The second RF pulse 102 is rendered slice selective by a second magnetic field gradient pulse 111 applied according to a second gradient function of time $f_{grad2}$, the second gradient function $f_{grad2}$ being a time reversed version of the first gradient function $f_{grad1}$ and, the sign of the second gradient function opposing that of the first gradient function, so $f_{grad2}(t)=-f_{grad1}(T-t)$. The interval $\Delta t_1$ between the first and second RF pulses 101,102 is required for the switching of the magnetic field gradient pulses 110,111. During the application of the RF pulses the magnetic field gradient pulses must be constant. The interval $\Delta t_1$ should be as short as technically possible. The duration of the interval in practice amounts to, for example, 4 millisecond. The overall duration of the pulse concatenation is, for example 2 milliseconds.

In order to judge the quality of the slice selectivity of the concatenation of the first and second selective RF pulses 101,102 used for inversion of the magnetization the concatenation of said pulses is applied during in a computer simulation and compared with a slice selectivity of a conventional RF inversion pulse used for the inversion of the magnetization. This conventional pulse comprises an asymmetric amplitude envelope and is numerically optimised for a linear phase of the spins throughout the slice. The conventional RF pulse is known from the cited handbook "Magnetic Resonance Imaging", by M. T. Vlaardingerbroek. The result of the comparison is shown in FIG. 3.

Figure 3:
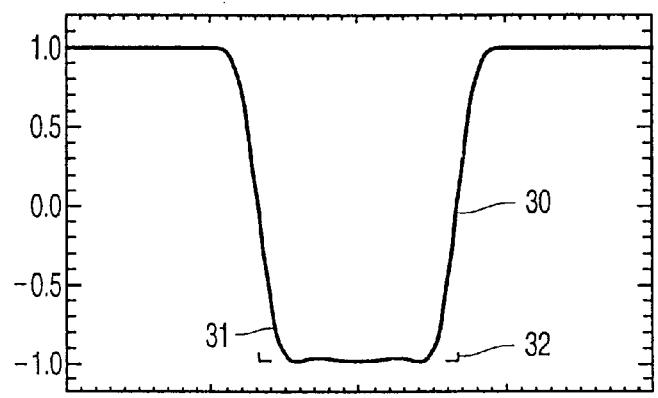
FIG. 3 shows selected slice profiles in a body.
Figure 3:
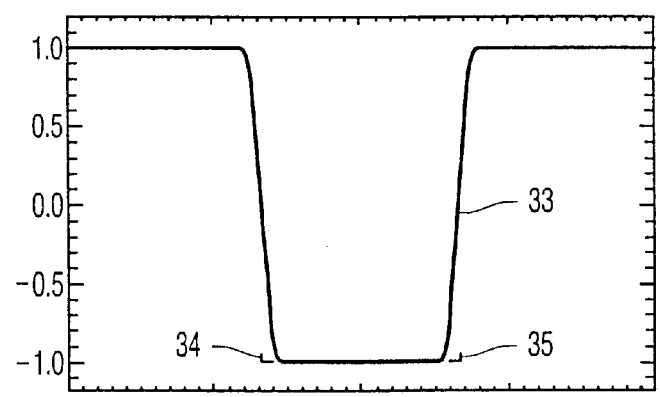

FIG. 3 shows profiles of selected second slices in a body with different inversion pulses: a first profile 30 of a slice selected by said conventional RF pulse and a second profile 33 of the slice selected by the concatenation of the first selective RF pulse 101 and the second selective RF pulse 102. The improved quality of the second profile 33 of the slice selected by the concatenation of the first and second selective RF pulses 101,102 can be judged, for example by the acuteness of the first and the second angle 31,32 of the first profile 30 and the third and the fourth corner 34,35 of the second profile 33. In FIG. 3 the third and fourth corners 34,35 of the second profile 33 of the selected slice show improved acuteness. Furthermore, a quality in respect of a selected slice profile can be defined, for example, as a ratio of the missing magnetic moment between the slice limits and a magnetic moment of a perfectly rectangular slice. The slice limits are defined such that a magnetic moment in the z-direction outside the selected slice is equal to a missing magnetic moment in the z-direction inside the selected slice. For a perfectly rectangular slice profile the ratio will be zero percent. The ratio of the selected slice profile of a concatenation of the first and second selective RF pulses amounts to, for example 3.5%. The ratio of the selected slice profile resulting from the application of said conventional RF pulse amounts to, for example 7%. The concatenation of the first selective RF pulse 101 and the second selective RF pulse 102 can be used as a pulse for labelling a liquid for use in MR flow imaging.

Figure 4:
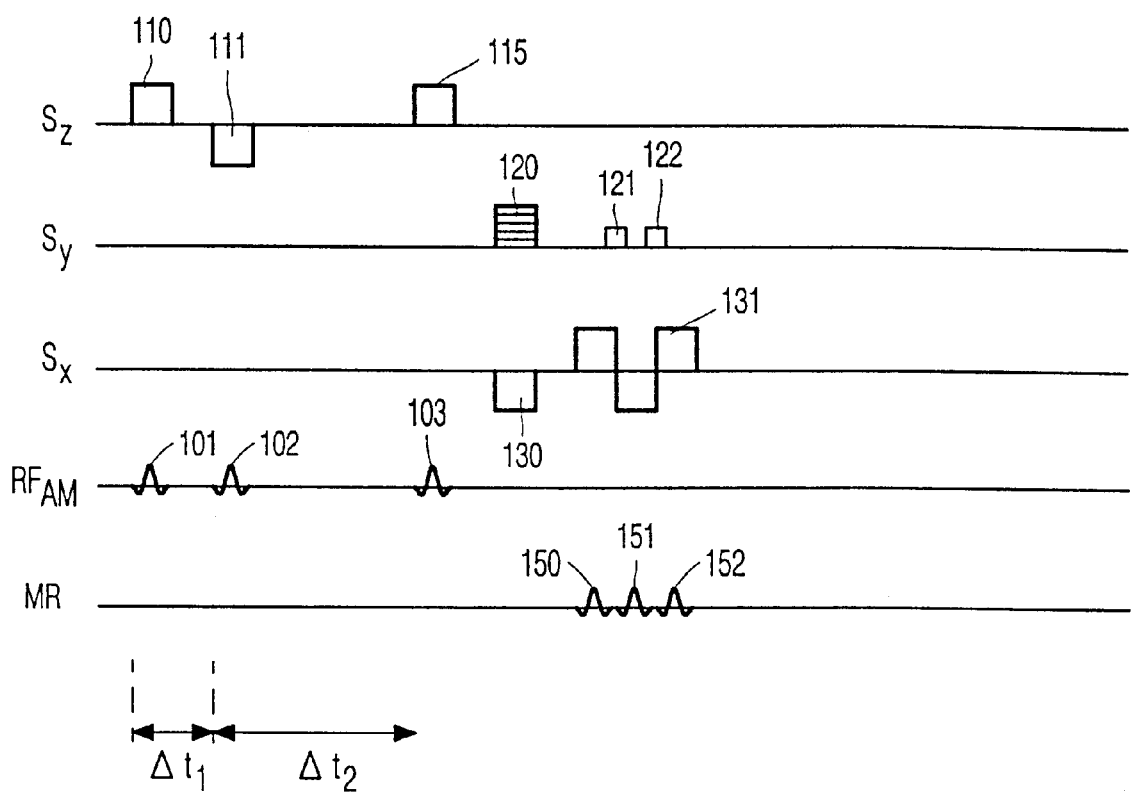
FIG. 4 shows a first example of a concatenation of the first and second selective RF pulses for use as an inversion pulse.
Figure 6:
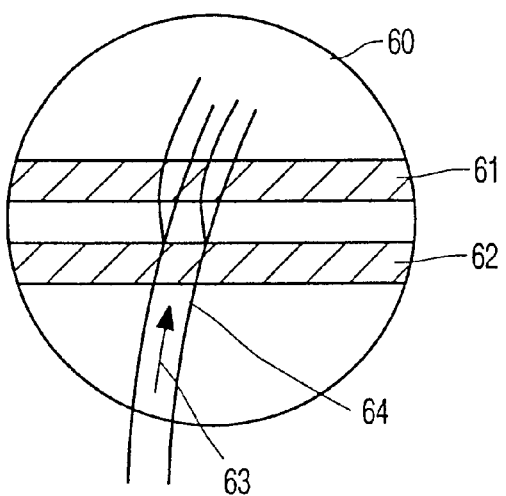
FIG. 6 shows the position of the selected first and second slices in the body.

FIG. 4 shows a first example of a concatenation of first and second selective RF pulses for use as a labelling pulse. The labelling of a fluid, for example blood, is performed in a first slice of the body where the labelling produces an MR image of the labelled blood flowing in a second slice downstream from the first slice in the body by application of a known Echo Planar Imaging (EPI) sequence. An EPI sequence is known per se from the cited WO 93/1509. In FIG. 6 the position of the selected first and second slices in a part of the body is indicated.

FIG. 6 shows a part of body 60 and the selected first slice 61 and the selected second slice 62, the position of the first slice 61 being downstream with respect to a flow of blood 63 in an artery 64. Application of the concatenation of the first and second selective RF pulses 101,102 inverts a direction of the magnetization in the selected second slice 62 with respect to the direction of the steady magnetic field.

Referring to FIG. 4 again, the generation of the first and second RF pulses 101,102 is analogous to the application of the concatenation of the RF pulses 101, 102 as described in relation to FIG. 2. After a delay $\Delta t_2$ after the concatenation of the selective RF pulses 101,102, the EPI imaging sequence commences with the excitation RF pulse 103, having a flip angle $\alpha_2$, and the simultaneously application of the third slice selective magnetic field gradient pulse 115 in order to excite nuclear spins in the selected first slice 61 of the body. The flip angle $\alpha_2$ is, for example 90°. After the slice selection an initial phase-encoding gradient 120 and an initial read gradient 130 are applied. Furthermore, phase-encoding gradients 121,122, referred to as blips, are applied after the second and further lobes of the read gradient 131 in order to measure MR signals 150,151,152 along a plurality of parallel lines in the k-space. Preferably, the lines are regularly distributed and extend parallel to a $k_x$-axis of the k-space. The EPI sequence is repeated for different values of the initial phase-encoding gradients 130 in order to obtain a complete set of measured MR signals corresponding to, for example 128 or 256 lines in the k-space. The image reconstruction unit 12 then reconstructs an MR image of the selected first slice 61 from the measured set of MR signals. An image processor 13 displays the reconstructed MR images, for example on a monitor 14.

In order to use the concatenation of pulses as an inversion pulse in an inversion recovery imaging sequence, the second slice 62 is selected such that it coincides with the first slice 61 in the body. In this case the MR image obtained shows a $T_1$ weighted contrast. The inversion recovery imaging sequences is known per see from "Magnetic Resonance Imaging" by M. T. Vlaardingerbroek et al, Springer-Verlag, 1996, page 77. Furthermore, when the first slice 61 coincides with the second slice 62, the concatenation of the first selective RF pulse 101 and the second RF pulse 102 can be applied as a refocusing pulse or refocusing pulses in a known spin echo sequence. Spin echo imaging sequences are known per se from the cited WO 93/01509.

Figure 5:
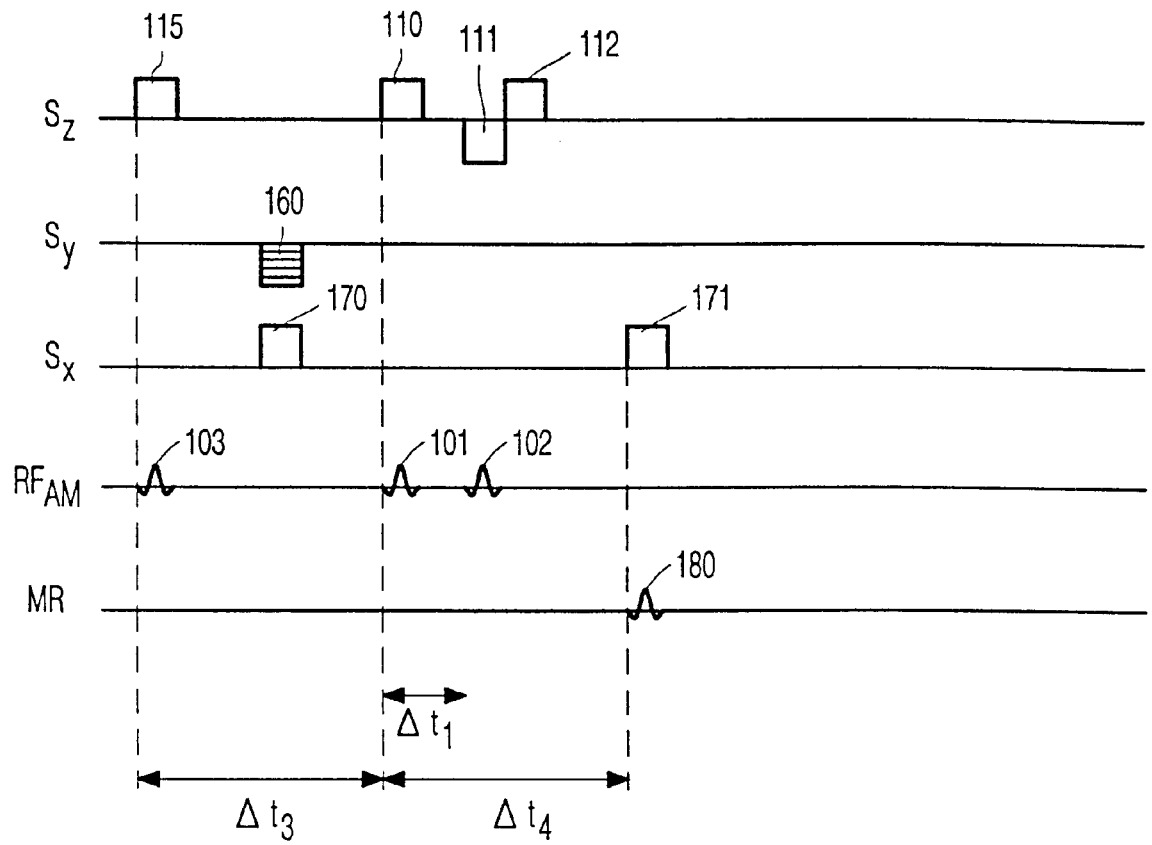
FIG. 5 shows a second example of a concatenation of the first and second selective RF pulses for use as a refocusing pulse.

FIG. 5 shows a second example of a concatenation of the first and second selective RF pulses 101,102 for use as a refocusing pulse in a spin echo sequence. The spin echo sequence commences with an excitation RF pulse 103, having a flip angle $\alpha_2$, and the simultaneously application of the slice selective magnetic field gradient pulse 115 in order to excite nuclear spins in the selected first slice 61 of the body. The flip angle $\alpha_2$ is, for example 90 degrees. Due to magnetic inhomegeneities and spin—spin interaction, the spins dephase in the selected first slice 61. After an interval $\Delta t_3$, the concatenation of the first and second selective RF pulses 101,102, both having a flip angle $\alpha_3$, is generated and the spins in the selected first slice 61 rephase. The generation of the slice selective RF pulses 101,102 is analogous to the application of the concatenation of the slice selective RF pulses 101, 102 described in relation to FIG. 2. After a second interval $\Delta t_4$, having the same duration as the interval $\Delta t_3$, a spin echo MR signal 180 is measured while simultaneously applying a read gradient 171. Preferably, the flip angle $\alpha_3$ of the excitation RF pulse 103 amounts to 90 degrees. After the slice selection and before the concatenation of the first and second selective RF pulses 101, 102, a phase-encoding gradient 160 and an initial read gradient 170 are applied. The spin echo sequence is repeated for different values of the phase-encoding gradients 160 in order to obtain a complete set of measured MR signals 180 such that the k-space is scanned along a plurality of parallel lines which are regularly distributed in the k-space and extend parallel to the $k_x$-axis. For example the number of lines in the k-space amounts to 128 or 256. The image reconstruction unit 12 then reconstructs an image of the selected first slice 61 from the measured set of MR signals 180.

Furthermore, a third magnetic field gradient pulse 112 in the z-direction is superposed on the steady magnetic field. The third magnetic field gradient pulse has the same direction as the first magnetic field gradient pulse 110. The area of the additional third magnetic field pulse 112 depends on the area of the preceding first and second magnetic field gradient pulses 110,111 and also on the modulation functions $f_{fm1}(t)$, $f_{fm2}(t)$. of the first and second RF pulses 101,102. For example, the area of the additional third magnetic field pulse 112 is equal to the area of the second magnetic field pulse 111. Furthermore, the area of the third magnetic field gradient pulse 112 is numerically optimized so that a maximum number of spins is refocused in the selected first slice 61.

What is claimed is:

1. A method for determining an image of a first portion of a body placed in a steady magnetic field by means of magnetic resonance (MR) comprising:

excitation of nuclear spins in the first portion of the body, measurement of a data set of MR signals of the first portion of the body, reconstruction of an image from the measured data set, and generation of an RF pulse for a rotation of a magnetization in a second portion of the body with respect to a direction of the steady magnetic field, wherein the RF pulse for rotation of the magnetization in the second portion of the body comprises a concatenation of a first selective RF pulse and a second selective RF pulse.

2. A method as claimed claim 1, wherein a first magnetic field gradient pulse is generated with the first selective RF pulse according to a first gradient function of time, a second magnetic field gradient pulse is generated with the second selective RF pulse according to a second gradient function of time, which second gradient function of time is a time reversed version of the first gradient function, and where a sign of the second gradient function opposes that of the first gradient function, the first selective RF pulse is applied according to a first amplitude modulation function of time and a first frequency modulation function of time, the second RF pulse is applied according to a second amplitude modulation function and a second frequency modulation function, the second amplitude modulation function is a time reversed version of the first amplitude function, the second frequency modulation function is a time reversed version of the first frequency modulation function, and a sign of the second frequency modulation function opposes that sign of the first frequency modulation function.

3. A method as claimed in claim 1 wherein a flip angle of the first selective RF pulse and the flip angle of the second RF pulse amount to about 90 degrees.

4. A method as claimed in claim 1, wherein the RF pulse for rotation of the magnetization is generated before the excitation of the spins in the first portion of the body.

5. A method as claimed in claim 1, wherein the RF pulse for rotation of the magnetization is generated after the excitation of spins in the first portion of the body, and a further magnetic field gradient pulse is applied in a direction normal to the slice as a refocusing pulse for generating an MR signal.

6. A method as claimed in claim 1, wherein a time interval between the first RF pulse and the second RF pulse amounts to approximately 4 millisecond.

7. An MR device for the acquisition of images of a portion of a body comprising:

means for generating a substantially uniform steady magnetic field in the portion of the body, means for generating temporary magnetic gradient fields, means for generating RF pulses, means for receiving MR signals, processing means for reconstructing an image of the MR signals received, control means for generating control signals for the means for generating temporary magnetic gradient fields and for the means for generating RF pulses, wherein the control means is arranged to generate an MR imaging sequence comprising an RF excitation pulse and an RF pulse for a rotation of a magnetization within a second portion of the body, and wherein the control means for generating the MR imaging sequence is further arranged such that the RF pulse for rotation of a magnetization comprises a concatenation of a first selective RF pulse and a second selective RF pulse.

* * * * *